US012666546B2

(12) United States Patent
Iida et al.

(10) Patent No.: US 12,666,546 B2
(45) Date of Patent: Jun. 23, 2026

(54) CIRCUIT BOARD WITH A PLURALITY OF LAMINATED INSULATING LAYERS HAVING CONDUCTIVE PASTE FILLED VIAS AND MANUFACTURING METHOD THEREOF

(71) Applicant: FICT LIMITED, Nagano (JP)

(72) Inventors: Kenji Iida, Nagano (JP); Norikazu Ozaki, Nagano (JP); Taiji Sakai, Nagano (JP); Takashi Nakagawa, Nagano (JP); Kenji Takano, Nagano (JP); Takayuki Inaba, Nagano (JP); Akira Yajima, Nagano (JP); Shin Hirano, Nagano (JP); Kota Aoi, Nagano (JP); Tetsuro Miyagawa, Nagano (JP)

(73) Assignee: FICT LIMITED, Nagano (JP)

( * ) Notice: Subject to any disclaimer, the term of this patent is extended or adjusted under 35 U.S.C. 154(b) by 718 days.

(21) Appl. No.: 17/924,273

(22) PCT Filed: Mar. 1, 2021

(86) PCT No.: PCT/JP2021/007593
§ 371 (c)(1),
(2) Date: Nov. 9, 2022

(87) PCT Pub. No.: WO2021/246005
PCT Pub. Date: Dec. 9, 2021

(65) Prior Publication Data
US 2023/0180398 A1 Jun. 8, 2023

(30) Foreign Application Priority Data

Jun. 2, 2020 (JP) ................................ 2020-095845

(51) Int. Cl.
*H05K 3/46* (2006.01)
*H05K 1/11* (2006.01)
*H05K 3/40* (2006.01)

(52) U.S. Cl.
CPC ........... *H05K 3/4614* (2013.01); *H05K 1/115* (2013.01); *H05K 3/4069* (2013.01);
(Continued)

(58) Field of Classification Search
CPC .............. H01L 23/5226; H05K 3/4614; H05K 3/4635; H05K 2201/09564; H05K 1/115;
(Continued)

(56) References Cited

U.S. PATENT DOCUMENTS 6,281,446 B1 * 8/2001 Sakamoto ............... H01L 23/13
257/E23.172
6,413,620 B1 * 7/2002 Kimura .................... H05K 3/20
428/209
(Continued)

FOREIGN PATENT DOCUMENTS

JP 2002-208763 A 7/2002
JP 2004-158671 A 6/2004
(Continued)

OTHER PUBLICATIONS

International Search Report dated Apr. 27, 2021, issued in counterpart International Application No. PCT/JP2021/007593. (2 pages).

*Primary Examiner* — Alonzo Chambliss
(74) *Attorney, Agent, or Firm* — WHDA, LLP

(57) ABSTRACT

A circuit board includes a plurality of first insulating base materials and a plurality of second insulating base materials that are alternately laminated, a first metal layer being formed into a pattern shape on a first surface of the first insulating base material, and a second metal layer being formed into a pattern shape on a second surface of the first
(Continued)

insulating base material. The first metal layer is formed into a trapezoidal shape that is large in diameter on a first surface side of the first insulating base material. The second metal layer is formed into a trapezoidal shape that is large in diameter on a second surface side of the first insulating base material. The first metal layers and the second metal layers are laminated in such a manner that the trapezoidal shapes are alternately oriented.

4 Claims, 7 Drawing Sheets

(52) U.S. Cl.
CPC ......... *H05K 3/4623* (2013.01); *H05K 3/4635* (2013.01); *H05K 2201/09563* (2013.01); *H05K 2201/096* (2013.01); *H05K 2201/09827* (2013.01)

(58) Field of Classification Search
CPC ....... H05K 3/4623; H05K 2201/09563; H05K 2201/096; H05K 2201/09827; H05K 3/4069
See application file for complete search history.

(56) References Cited

U.S. PATENT DOCUMENTS

| | | | |
|---|---|---|---|
| 8,481,424 B2 * | 7/2013 | Takahashi | H05K 1/115 |
| | | | 257/774 |
| 8,966,750 B2 * | 3/2015 | Ikeda | H05K 3/4602 |
| | | | 29/829 |
| 2002/0127379 A1 | 9/2002 | Suzuki et al. | |
| 2013/0168148 A1 | 7/2013 | Kanai et al. | |
| 2016/0338193 A1 | 11/2016 | Kanai et al. | |
| 2019/0090359 A1 | 3/2019 | Ito | |
| 2019/0387613 A1 * | 12/2019 | Taniguchi | H05K 3/4688 |

FOREIGN PATENT DOCUMENTS

| | | |
|---|---|---|
| JP | 2006-66738 A | 3/2006 |
| JP | 2016-219452 A | 12/2016 |
| WO | 2012/077288 A1 | 6/2012 |
| WO | 2018/155089 A1 | 8/2018 |

* cited by examiner

CIRCUIT BOARD WITH A PLURALITY OF LAMINATED INSULATING LAYERS HAVING CONDUCTIVE PASTE FILLED VIAS AND MANUFACTURING METHOD THEREOF

TECHNICAL FIELD

The present invention relates to a circuit board, a method for manufacturing the circuit board, and an electronic device using the circuit board.

BACKGROUND ART

Circuit boards, such as printed circuit boards, are generally widely used heretofore in order to compactly incorporate electronic components in electronic devices. The printed circuit board is produced by etching a copper foil adhering to a laminated plate, in accordance with an electronic circuit pattern. The printed circuit board is difficult to densely mount electronic components, but is advantageous in cost.

Meanwhile, in response to demands for smaller size, higher performance, lower price, etc., with respect to electronic devices, fining and multi-layering of electronic circuits of circuit boards, and high-density packaging of electronic components, have been rapidly progressing. Thus, multilayer printed circuit boards have been actively considered for circuit boards.

In manufacturing a multilayer printed circuit board as a circuit board having a multi-layer structure, multiple insulating base materials that are formed with wiring patterns are joined to one another by adhesive layers, as in the case in PTL 1, for example.

In addition, a build-up multilayer wiring board has been developed as a multilayer wiring board, and it can be formed by laminating a substrate layer, which is made of an insulating material, and a conductive pattern, on each side of a base core material, in the order of forming the conductive pattern on the substrate layer, as in the case in PTL 2.

CITATION LIST

Patent Literature

PTL 1: JP-A-2006-66738
PTL 2: JP-A-2004-158671

SUMMARY OF INVENTION

Technical Problem

In the case of joining to one another a plurality of substrates by providing adhesive layers, as disclosed in PTL 1 described above, the adhesive layers are not essential materials in a manufactured multilayer printed circuit board, in the first place. Moreover, a high speed transmission board using such adhesive layers may not satisfy required electric characteristics. Furthermore, these adhesive layers cause a great waste of cost.

On the other hand, as to a build-up multilayer wiring board, as disclosed in PTL 2, the manufacturing process takes a very long time, and the whole yield in multilayering is affected by yield per layer that is a multiplier of the number of layers, resulting in high production cost.

The present invention has been made to solve the above issues, and an object of the present invention is to provide a circuit board that can be manufactured in a short process without using an adhesive layer, a method for manufacturing the circuit board, and an electronic device.

Solution to Problem

A circuit board according to the present invention includes a plurality of first insulating base materials and a plurality of second insulating base materials that are alternately laminated, a first metal layer being formed into a pattern shape on a first surface of the first insulating base material, and a second metal layer being formed into a pattern shape on a second surface of the first insulating base material. The circuit board also includes a first conductive paste being filled into a through hole of the first insulating base material so as to connect the first metal layer and the second metal layer, and a second conductive paste being filled into a through hole of the second insulating base material so as to connect the second metal layer of the first insulating base material that is laminated on a first surface side of the second insulating base material, and the first metal layer of the first insulating base material that is laminated on a second surface side of the second insulating base material. The first metal layer is formed into a trapezoidal shape that is large in diameter on the first surface side of the first insulating base material. The second metal layer is formed into a trapezoidal shape that is large in diameter on the second surface side of the first insulating base material. The first metal layers and the second metal layers are laminated in such a manner that the trapezoidal shapes are alternately oriented.

The circuit board may have the following characteristics: the second metal layer of the first insulating base material that is laminated on the first surface side of the second insulating base material, is embedded in the first surface of the second insulating base material, and the first metal layer of the first insulating base material that is laminated on the second surface side of the second insulating base material, is embedded in the second surface of the second insulating base material.

The circuit board may be characterized in that the first insulating base material and the second insulating base material are joined together without using an adhesive layer.

With this structure, a multilayer circuit board is constructed without using an adhesive layer, resulting in improving electric characteristics, shortening a production process, enhancing yield, and reducing cost.

A method for manufacturing a circuit board according to the present invention includes a process of manufacturing a unit component. The unit component includes a first insulating base material in a cured state and a second insulating base material in a semi-cured state. The first insulating base material includes a first metal layer, a second metal layer, and a first through hole that is formed between the first metal layer and the second metal layer. The first metal layer is formed into a pattern shape on a first surface of the first insulating base material. The second metal layer is formed into a pattern shape on a second surface of the first insulating base material. The first through hole is filled with a first conductive paste that connects the first metal layer and the second metal layer. The second insulating base material is disposed on the second surface side of the first insulating base material and includes a second through hole that communicates with the second metal layer. The second through hole is filled with a second conductive paste that is connected to the second metal layer. The method also includes a process of laminating a plurality of the unit components by joining to one another the first insulating base material of one of the plurality of the unit components and the second insulating base material of another unit component of the plurality of the unit components.

In this method, a plurality of unit components are manufactured in advance, and a multilayer circuit board is manufactured by laminating the plurality of the unit components. Thus, employing this method enables shortening a manufacturing process and reducing cost.

The method may have the following characteristics: the first metal layer is formed into a trapezoidal shape that is large in diameter on the first surface side of the first insulating base material, and the second metal layer is formed into a trapezoidal shape that is large in diameter on the second surface side of the first insulating base material.

The method may be characterized in that the second metal layer of the unit component is embedded in the second insulating base material in the process of manufacturing the unit component.

The method may be characterized in that the first metal layer of the one unit component is embedded in the second insulating base material of the another unit component in joining to one another the first insulating base material of the one unit component of the plurality of the unit components and the second insulating base material of the another unit component of the plurality of the unit components.

The method may be characterized in that the unit component includes the first insulating base material and the second insulating base material that are joined together without using an adhesive layer.

The method may be characterized in that the plurality of the unit components are laminated by joining to one another without using adhesive layers.

An electronic device according to the present invention is characterized by including the circuit board according to claims 1 to 3 and an electronic component.

Advantageous Effects of Invention

In the present invention, a plurality of unit components are manufactured, and a multilayer circuit board is then manufactured by laminating the plurality of the unit components. Thus, it is possible to shorten a manufacturing process, enhance yield, and reduce cost.

4

Figure 8:
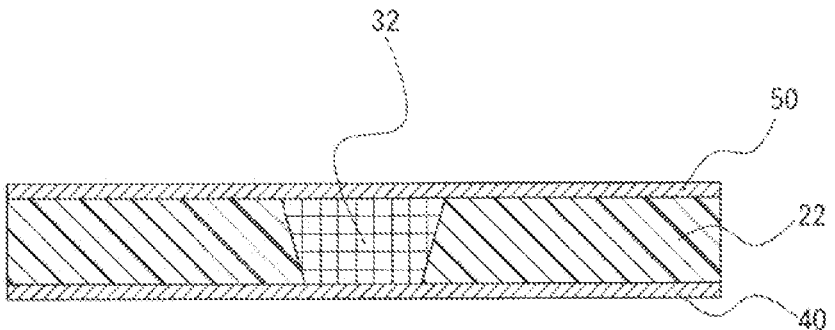

FIG. 8 is a schematic sectional view illustrating the example of the method for manufacturing the circuit board (Part 7).

Figure 9:
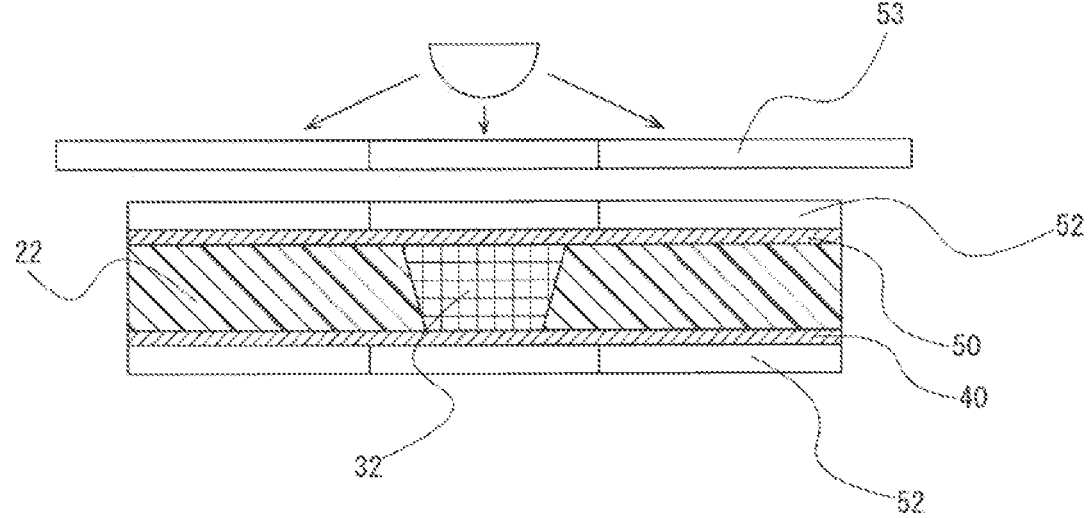

FIG. 9 is a schematic sectional view illustrating the example of the method for manufacturing the circuit board (Part 8).

Figure 10:
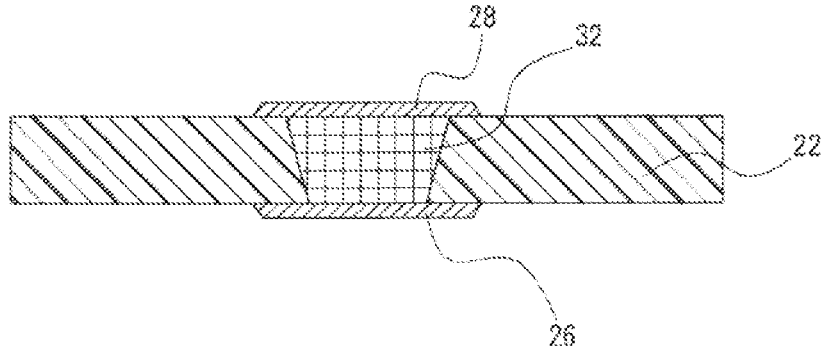

FIG. 10 is a schematic sectional view illustrating the example of the method for manufacturing the circuit board (Part 9).

Figure 11:
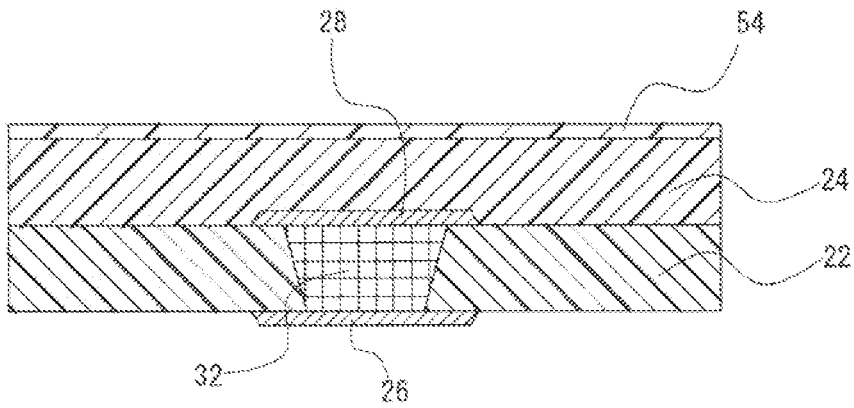

FIG. 11 is a schematic sectional view illustrating the example of the method for manufacturing the circuit board (Part 10).

Figure 12:
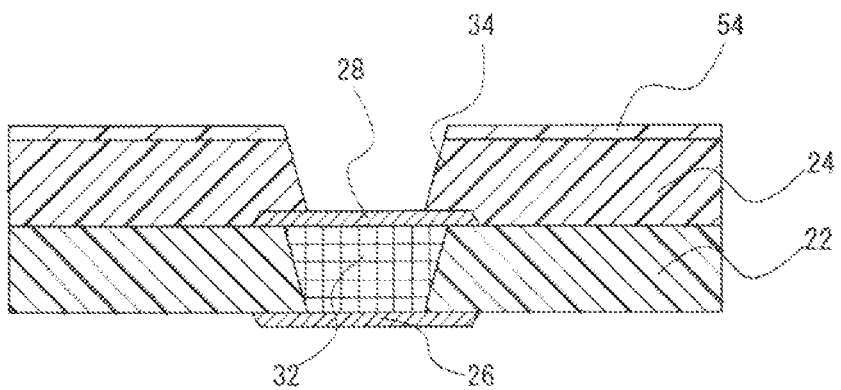

FIG. 12 is a schematic sectional view illustrating the example of the method for manufacturing the circuit board (Part 11).

Figure 13:
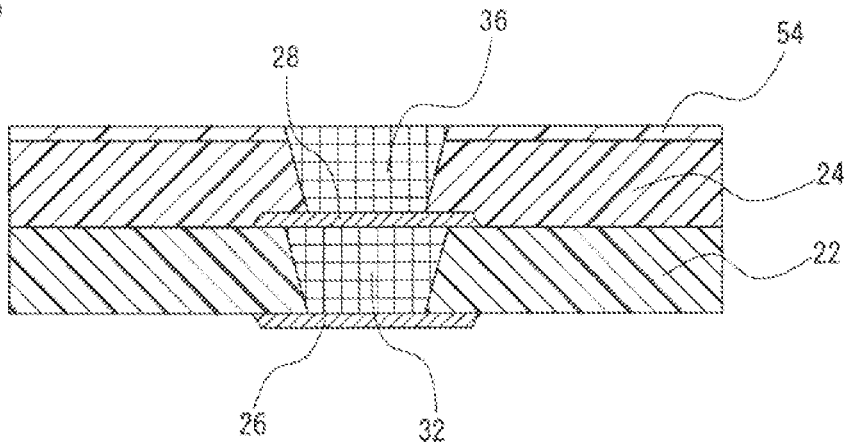

FIG. 13 is a schematic sectional view illustrating the example of the method for manufacturing the circuit board (Part 12).

Figure 14:
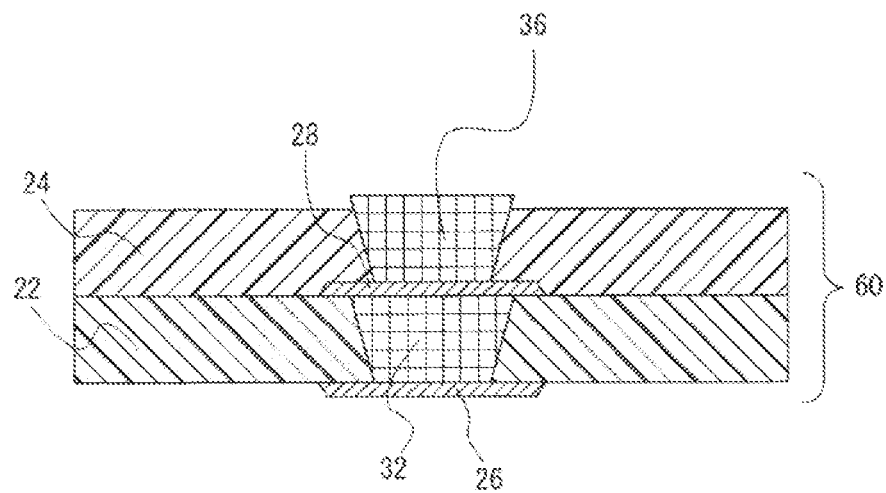

FIG. 14 is a schematic sectional view illustrating the example of the method for manufacturing the circuit board (Part 13).

Figure 15:
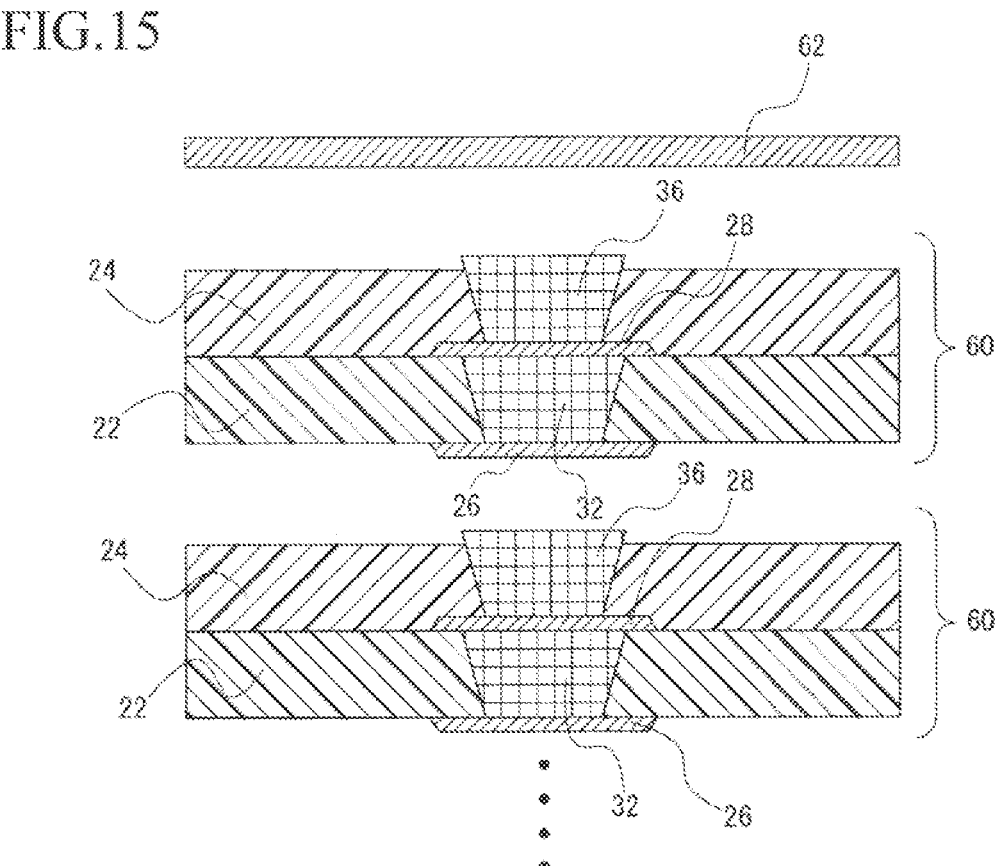

FIG. 15 is a schematic sectional view illustrating the example of the method for manufacturing the circuit board (Part 14).

Figure 16:
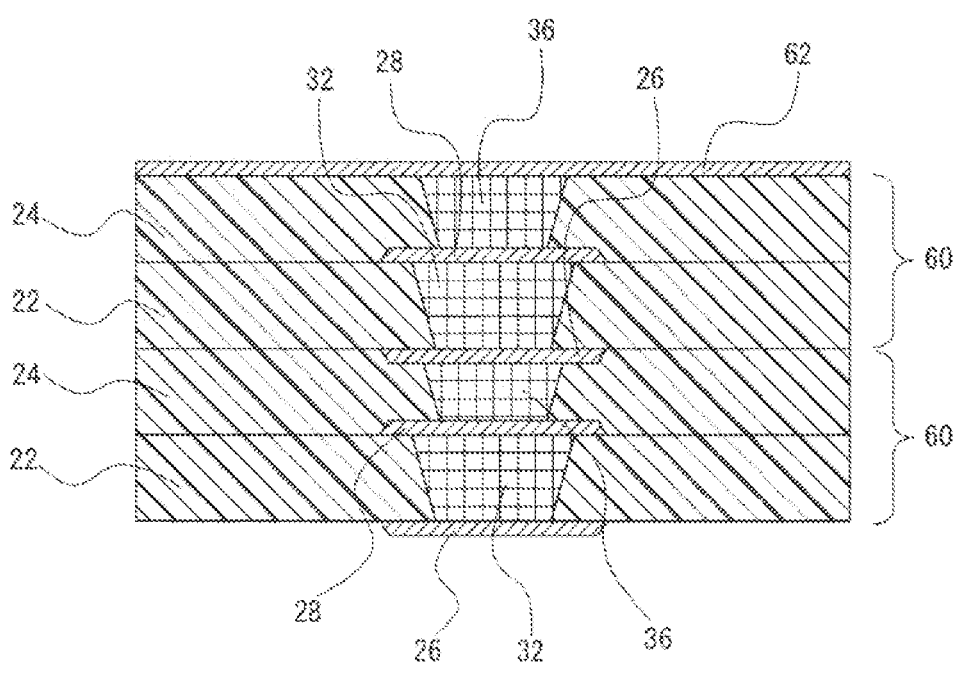

FIG. 16 is a schematic sectional view illustrating the example of the method for manufacturing the circuit board (Part 15).

Figure 17:
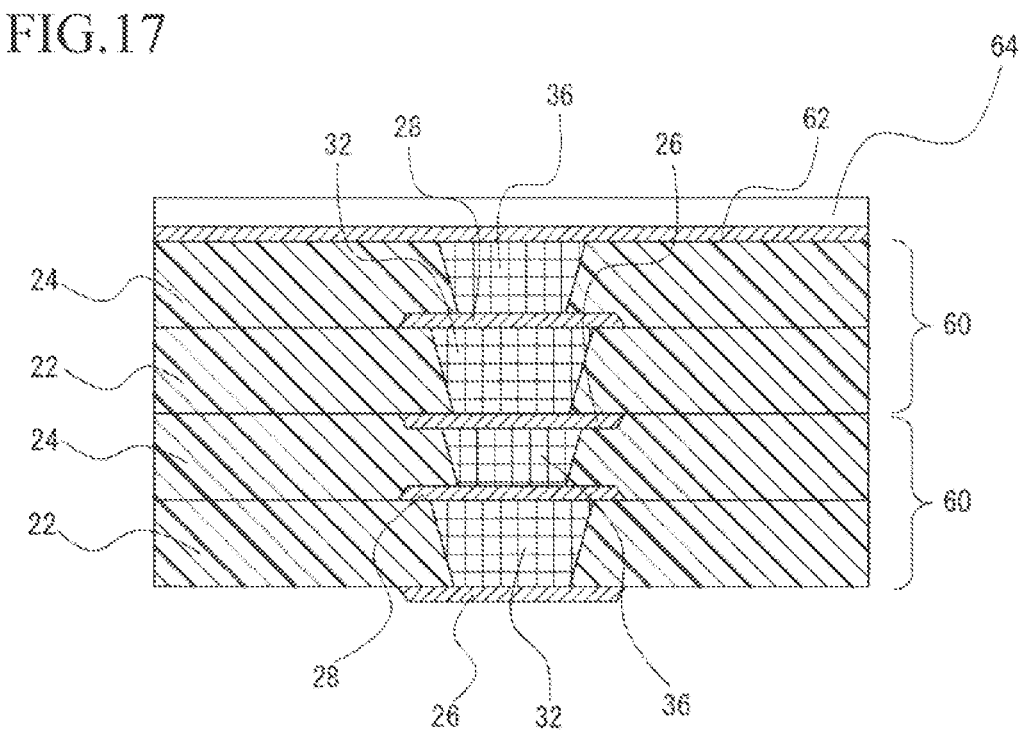

FIG. 17 is a schematic sectional view illustrating the example of the method for manufacturing the circuit board (Part 16).

Figures 18, 19:
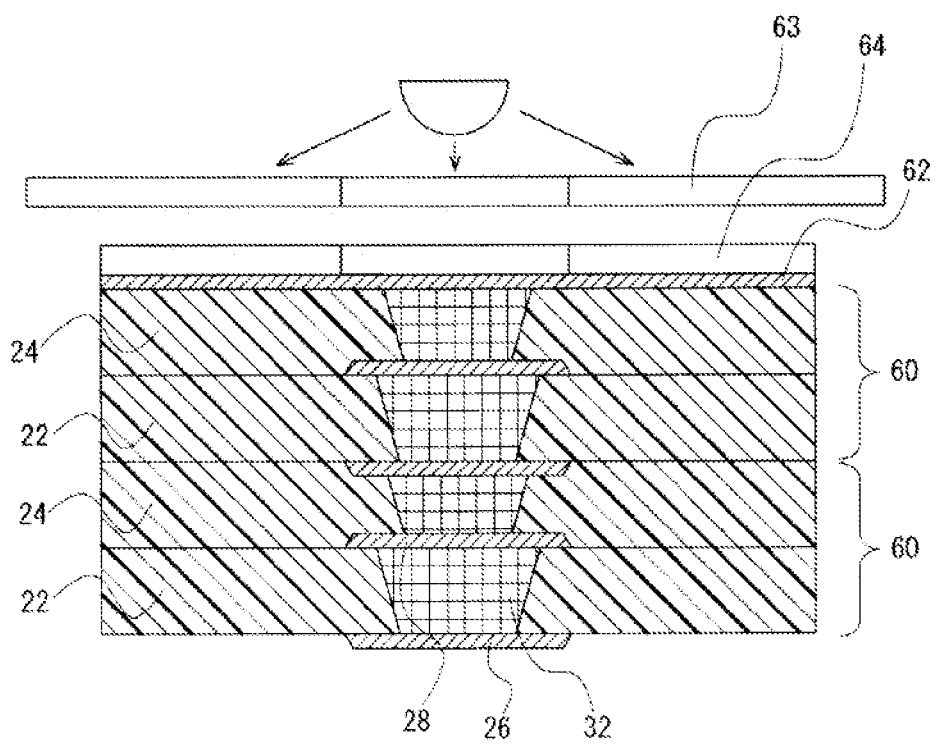

FIG. 18 is a schematic sectional view illustrating the example of the method for manufacturing the circuit board (Part 17).

FIG. 19 is a schematic sectional view illustrating the example of the method for manufacturing the circuit board (Part 18).

DESCRIPTION OF EMBODIMENTS (Circuit Board)

Figure 1:
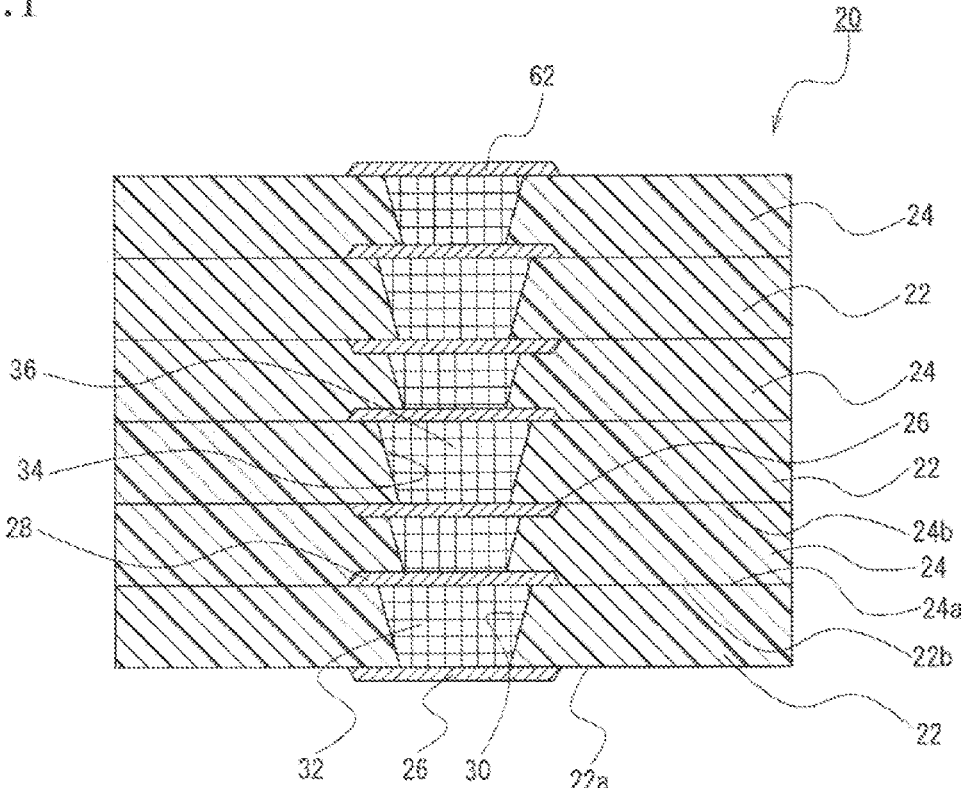
FIG. 1 is a schematic sectional view illustrating an example of a circuit board.

FIG. 1 shows a schematic sectional view of a circuit board.

A circuit board 20 of this embodiment is constructed by alternately laminating first insulating base materials 22 and second insulating base materials 24 without using adhesive layers.

The first insulating base material 22 has a patterned first metal layer 26 that is formed on a first surface 22a thereof, and it also has a patterned second metal layer 28 that is formed on a second surface 22b on a side opposite to the first surface 22a.

The first insulating base material 22 is formed with a through hole 30 that opens on a first metal layer 26 side and on a second metal layer 28 side so as to make the first metal layer 26 and the second metal layer 28 communicate with each other. The through hole 30 is filled with a first conductive paste 32 that electrically connects the first metal layer 26 and the second metal layer 28.

In this embodiment, the through hole 30 is formed in such a manner as to gradually increase in diameter from the first surface 22a to the second surface 22b, and the first conductive paste 32 has a cone shape.

The second insulating base material 24 is disposed on a second surface 22b side of the first insulating base material 22.

The second metal layer 28, which is formed on the second surface 22b of the first insulating base material 22, is embedded in the second insulating base material 24 at the first surface 24a (that is, on a side of the surface facing the first insulating base material 22 of the second insulating base material 24 (lower side in FIG. 1)).

The first metal layer 26, which is formed on the first surface 22a of the first insulating base material 22 on the second insulating base material 24, is embedded in the second insulating base material 24 on a second surface 24b side, that is, on an upper side in FIG. 1.

The second insulating base material 24 is formed with a through hole 34 that opens on the second metal layer 28 side and on the first metal layer 26 side so as to make the embedded second metal layer 28 and the embedded first metal layer 26 communicate with each other. The through hole 34 is filled with a second conductive paste 36 that electrically connects the second metal layer 28 and the first metal layer 26.

In this embodiment, the through hole 34 is formed in such a manner as to gradually increase in diameter from the first surface 24a to a second surface 24b of the second insulating base material 24, and the second conductive paste 36 has a cone shape.

The first metal layer 26 has a trapezoidal shape in which a side in contact with the first insulating base material 22 is large in diameter and the other side not in contact with the first insulating base material 22 is small in diameter.

On the other hand, the second metal layer 28 has a trapezoidal shape in which a side in contact with the first insulating base material 22 is large in diameter and the other side not in contact with the first insulating base material 22 is small in diameter.

In the circuit board 20 of this embodiment, the first insulating base materials 22 and the second insulating base materials 24 are alternately laminated, and each of the metal layers 26 and 28 is provided at a boundary between the first insulating base material 22 and the second insulating base material 24 while being embedded in the second insulating base material 24.

Each of the metal layers 26 and 28 is not embedded in the first insulating base material 22.

In addition, in the circuit board 20 of this embodiment, assuming that the first insulating base material 22 is a center, each of the metal layers 26 and 28 on both sides of the first insulating base material 22 has a trapezoidal shape that is large in diameter on a first insulating base material 22 side and that decreases in diameter in a direction away from the first insulating base material 22.

In consideration of the whole circuit board 20, the metal layers 26 and 28 are formed in such a manner that the trapezoidal first metal layers 26 decreasing in diameter toward a lower side and the trapezoidal second metal layers 28 decreasing in diameter toward an upper side are alternately arranged. However, only a surface metal layer 62 on the top surface of the circuit board 20 has a trapezoidal shape that decreases in diameter toward the upper side, and the trapezoidal shape is not oriented in an alternate manner only at the top surface.

In this manner, each of the metal layers 26 and 28 on both sides of the first insulating base material 22 has a trapezoidal shape that is large in diameter on the first insulating base material 22 side. These shapes are generated by etching metal layers that are disposed on both sides of the first insulating base material 22, from both sides of the first insulating base material 22, in a manufacturing process.

(Method for Manufacturing Circuit Board)

Next, a method for manufacturing a circuit board will be described based on FIGS. 2 to 19.

Figure 2:
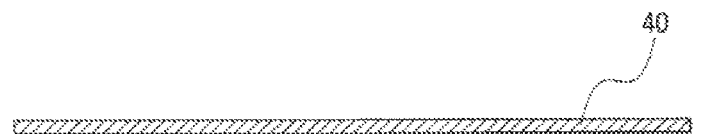
FIG. 2 is a schematic sectional view illustrating an example of a method for manufacturing a circuit board (Part 1).
Figure 3:
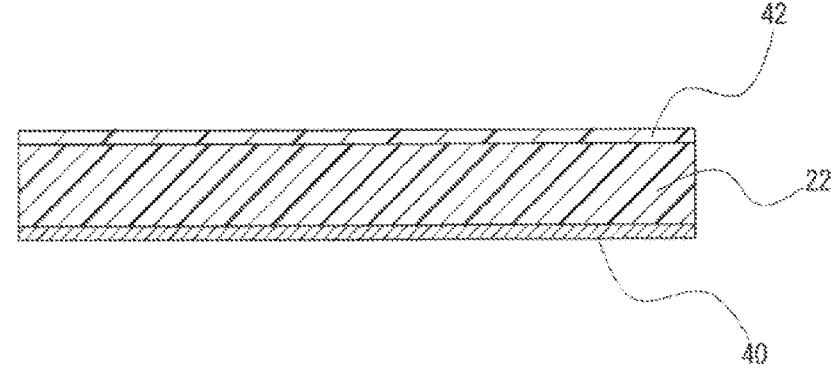
FIG. 3 is a schematic sectional view illustrating the example of the method for manufacturing the circuit board (Part 2).

First, as shown in FIGS. 2 and 3, the first insulating base material 22 in a semi-cured state (not completely cured) is laminated on a first metal foil 40, and a resin film 42 for mask is laminated on the top of the first insulating base material 22.

The first metal foil 40 can use a general copper foil, but it is not limited to a copper foil, and each type of metal foil, such as of nickel, can be appropriately selected in accordance with the purpose.

In addition, the first metal foil 40 may have a rough surface at least on the first insulating base material 22 side, and a metal foil subjected to a low-roughening treatment, such as an HVLP foil, can also be used.

The first insulating base material 22 preferably contains thermosetting resin or thermoplastic resin. For example, it is possible to use a pre-preg (a nonwoven fabric substrate or a woven fabric substrate, such as of glass fibers, impregnated with epoxy resin or the like). Note that the resin of the first insulating base material 22 may be, for example, bismale-imide-triazine resin that is thermosetting resin, or modified polyphenylene ether resin that is thermoplastic resin, on the condition that the resin is an insulating base material used in a circuit board.

Figure 4:
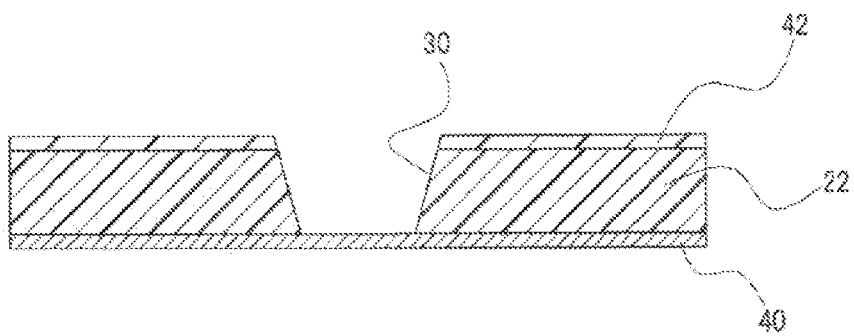
FIG. 4 is a schematic sectional view illustrating the example of the method for manufacturing the circuit board (Part 3).

FIG. 4 shows a state in which a through hole 30 is formed so as to penetrate in the thickness direction of the first insulating base material 22.

The through hole 30 is formed in such a manner as to penetrate the first insulating base material 22 and the resin film 42 and to be closed at the bottom by the metal foil 40. The through hole 30 can be formed by using laser, but it is not limited to the forming method using laser.

The type of laser in forming the through hole 30 may be $CO_2$ laser, YAG laser, or the like, but it can be selected as appropriate. In addition, also the output of laser is not specifically limited and can be appropriately selected.

Figure 5:
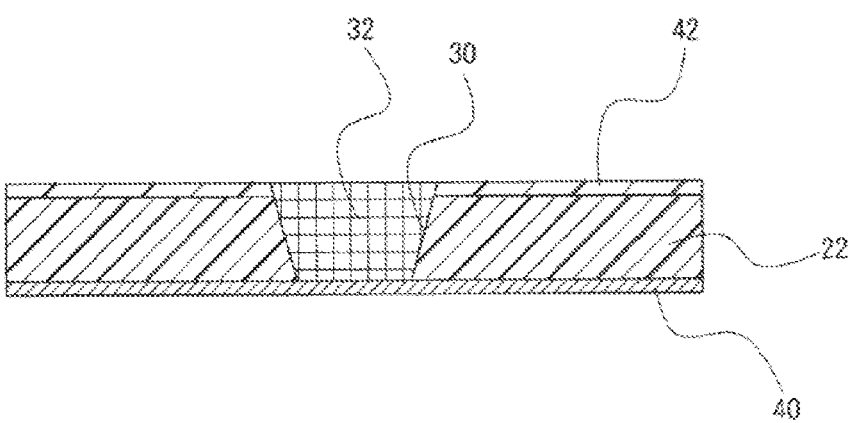
FIG. 5 is a schematic sectional view illustrating the example of the method for manufacturing the circuit board (Part 4).

FIG. 5 shows a state in which the first conductive paste 32 is filled into the through hole 30.

The first conductive paste 32 can use a mixture containing conductive filler and binder resin.

Examples of the conductive filler include metal particles, such as of copper, gold, silver, palladium, nickel, tin, and bismuth. One kind of metal particles may be used, or two or more kinds of metal particles may be mixed.

The binder resin can use, for example, epoxy resin, which is a kind of thermosetting resin. However, the binder resin is not limited to epoxy resin, and polyimide resin or the like may also be used. The binder resin may be thermoplastic resin, instead of thermosetting resin.

The method of filling the first conductive paste 32 into the through hole 30 includes a method of filling the first conductive paste 32 into the through hole 30 under atmospheric pressure or vacuum pressure with the use of a jig, such as a squeegee.

Figure 6:
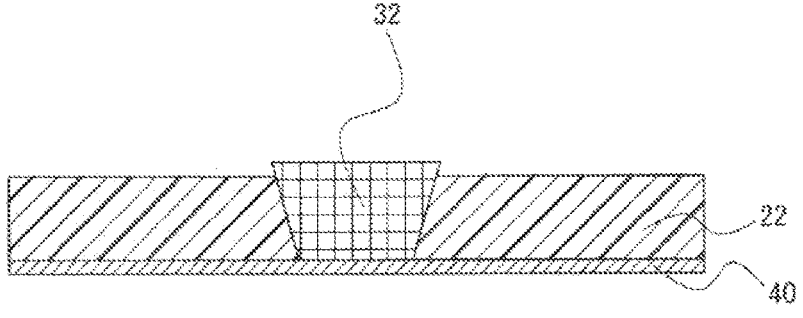
FIG. 6 is a schematic sectional view illustrating the example of the method for manufacturing the circuit board (Part 5).

FIG. 6 shows a state in which the resin film 42 is peeled off.

Due to peeling off of the resin film 42, the first conductive paste 32 protrudes from the opening of the second surface 22b of the first insulating base material 22 by the thickness of the resin film 42.

Figure 7:
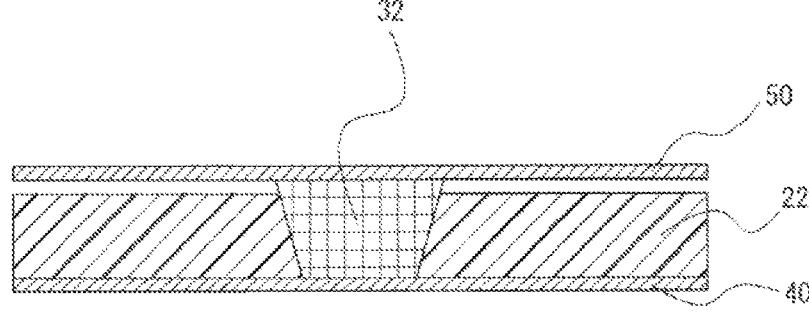
FIG. 7 is a schematic sectional view illustrating the example of the method for manufacturing the circuit board (Part 6).

FIGS. 7 and 8 show a state in which a second metal foil 50 is disposed on an upper surface (surface on a side opposite to the surface disposed with the first metal foil 40) of the first insulating base material 22, after the resin film 42 is peeled off.

The second metal foil 50 can use a general copper foil, but it is not limited to a copper foil, and each type of metal foil, such as of nickel, can be appropriately selected in accordance with the purpose.

In addition, the second metal foil 50 may have a rough surface on the first insulating base material 22 side, and a metal foil subjected to a low-roughening treatment, such as an HVLP foil, can also be used.

The first metal foil 40 and the second metal foil 50 are joined to the first insulating base material 22. The joining can be performed by thermocompression bonding or pressure bonding, and this cures the first conductive paste 32 and the first insulating base material 22.

Note that temperature and pressure of thermocompression bonding and pressure of pressure bonding can be appropriately selected in accordance with the materials of the first conductive paste 32 and the first insulating base material 22.

Then, as shown in FIG. 9, the first metal foil 40 and the second metal foil 50, which are disposed on both surfaces of the first insulating base material 22, are subjected to an etching process.

The etching process of this embodiment employs wet etching. Specifically, after a dry film 52 is attached to the surface of each of the first metal foil 40 and the second metal foil 50, the dry film 52 is exposed and is developed via a photomask 53, whereby the first metal layer 26 and the second metal layer 28 that are formed into predetermined patterns are produced.

In the etching process, the metal foils are formed into trapezoidal shapes having patterns so as to be the first metal layer 26 and the second metal layer 28. These shapes are generated because the etching process is performed by isotropic etching using chemicals.

As shown in FIG. 10, the etching process provides the first metal layer 26 having a trapezoidal shape being large in diameter on the first surface 22a side of the first insulating base material 22, and the second metal layer 28 having a trapezoidal shape being large in diameter on the second surface 22b side of the first insulating base material 22.

The surfaces of the first metal layer 26 and the second metal layer 28 in the state of being formed on both surfaces of the first insulating base material 22 are desirably subjected to a roughening treatment. However, it is not necessary to perform a roughening treatment on the surfaces of the first metal layer 26 and the second metal layer 28. Particularly in a case of requiring electric characteristics, an HVLP foil may be used as the metal layer, and a roughening treatment is not performed. In the case of not performing a roughening treatment on the metal layer, the metal layer and the insulating base material can be chemically closely bonded to each other by using a coupling agent or the like.

FIG. 11 shows a state in which the second insulating base material 24 in a semi-cured state (not completely cured) is laminated on the second surface 22b side of the first insulating base material 22 and a resin film 54 is laminated on the surface of the second insulating base material 24.

The second insulating base material 24 can use the same material as the first insulating base material 22 and preferably contains thermosetting resin or thermoplastic resin. For example, it is possible to use a pre-preg (a nonwoven fabric substrate or a woven fabric substrate, such as of glass fibers, impregnated with epoxy resin or the like). Note that the resin of the second insulating base material 24 may be, for example, bismaleimide-triazine resin that is thermosetting resin, or modified polyphenylene ether resin that is thermoplastic resin, on the condition that the resin is an insulating base material used in a circuit board.

The second insulating base material 24 is in a semi-cured state, and the second metal layer 28, which is formed on the second surface 22b of the first insulating base material 22, is embedded in the second insulating base material 24.

FIG. 12 shows a state in which the through hole 34 is formed so as to penetrate in the thickness direction of the second insulating base material 24.

The through hole 34 is formed in such a manner as to penetrate the second insulating base material 24 and the resin film 54 and to be closed at the bottom thereof by the second metal layer 28. The through hole 34 can be formed by using laser, but it is not limited to the forming method using laser.

The type of laser in forming the through hole 34 may be $CO_2$ laser, YAG laser, or the like, but it can be selected as appropriate. In addition, also the output of laser is not specifically limited and can be appropriately selected.

FIG. 13 shows a state in which the second conductive paste 36 is filled into the through hole 34.

The second conductive paste 36 can use the same material as the first conductive paste 32. The second conductive paste 36 can use a mixture containing conductive filler and binder resin.

Examples of the conductive filler include metal particles, such as of copper, gold, silver, palladium, nickel, tin, and bismuth. One kind of metal particles may be used, or two or more kinds of metal particles may be mixed.

The binder resin can use, for example, epoxy resin, which is a kind of thermosetting resin. However, the binder resin is not limited to epoxy resin, and polyimide resin or the like may also be used. The binder resin may be thermoplastic resin, instead of thermosetting resin.

The method of filling the second conductive paste 36 into the through hole 34 includes a method of filling the second conductive paste 36 into the through hole 34 under atmospheric pressure or vacuum pressure with the use of a jig, such as a squeegee.

FIG. 14 shows a state in which the resin film 54 on the surface of the second insulating base material 24 is peeled off.

Due to peeling off of the resin film 54, the second conductive paste 36 protrudes from the opening of the surface on the side opposite to the first insulating base material 22 side of the second insulating base material 24 by the thickness of the resin film 54.

In the condition in which the resin film 54 is peeled off, one unit component 60 having two laminated insulating base materials is completed.

The unit component 60 is composed of a lamination of the first insulating base material 22, which is cured, and the second insulating base material 24, which is laminated on the second surface 22b side of the first insulating base material 22 and is in a semi-cured state. The second metal layer 28 is embedded in the second insulating base material 24, and the second conductive paste 36 is also not cured and is raised on the second surface 24b side of the second insulating base material 24.

The unit component 60 includes the first metal layer 26 that is formed on the first surface 22a of the first insulating base material 22 and also includes the second metal layer 28 that is formed on the second surface 22b of the first insulating base material 22. The first metal layer 26 has a trapezoidal shape being large in diameter on the first surface 22a side and decreasing in diameter in a direction away from the first surface 22a. The second metal layer 28 has a trapezoidal shape being large in diameter on the second surface 22b side and decreasing in diameter in a direction away from the second surface 22b.

The method for manufacturing the circuit board of this embodiment involves laminating a plurality of the unit components 60 as shown in FIG. 14, whereby a multilayer circuit board is produced. Laminating a plurality of unit components that are prepared in advance, as in this embodiment, enables shortening the manufacturing time, compared with a case of forming a layer one by one as in a build-up multilayer circuit board.

FIG. 15 shows a state in which a plurality of unit components are laminated.

In laminating a plurality of the unit components 60, the second insulating base material 24 in a semi-cured state of one unit component 60 and the first insulating base material 22 in a cured state of another unit component 60 are joined together.

Thus, the first metal layer 26 of the another unit component 60 is embedded in the second insulating base material 24 of the one unit component 60.

FIGS. 15 to 19 illustrate a process of manufacturing a circuit board including the plurality of laminated unit components 60. Note that FIGS. 15 to 19 show an example of a four-layered circuit board including two laminated unit components 60.

First, a surface metal layer 62 is disposed on the top surface of the plurality of unit components 60 that are laminated (on the second insulating base material 24 side of the top unit component 60 among the plurality of the unit components 60). The surface metal layer 62 can use copper or the like; however, it is not limited to copper, and another metal can be selected as appropriate.

Note that although not shown in FIGS. 15 to 19, the first metal layer 26 on the bottom surface of the bottom unit component 60 among the plurality of the unit components 60 to be laminated may be a metal layer that is not patterned by etching but cover the whole bottom surface.

As shown in FIG. 16, after the surface metal layer 62 is disposed on the top surface, the surface metal layer 62 and the plurality of the unit components 60 are thermocompression-bonded or pressure-bonded.

The second insulating base material 24 and the second conductive paste 36 of each unit component 60 are cured by thermocompression bonding or pressure bonding, whereby the unit components 60 are bonded together.

In addition, the surface metal layer 62 on the top surface is joined to the second insulating base material 24 of the unit component 60 that is positioned at the top among the laminated unit components 60.

Note that temperature and pressure of thermocompression bonding can be appropriately selected in accordance with the materials of the first conductive paste 32, the first insulating base material 22, the second conductive paste 36, and the second insulating base material 24.

Next, as shown in FIGS. 17 and 18, the surface metal layer 62 is subjected to an etching process.

The etching process of this embodiment employs wet etching. Specifically, after a dry film 64 is attached to the surface of the surface metal layer 62, the dry film 64 is exposed and is developed via a photomask 63, whereby the surface metal layer 62 that is formed into a predetermined pattern is obtained.

If the first metal layer 26 on the bottom surface is still not patterned until this process, it may be patterned by an etching process in this stage.

As shown in FIG. 19, the multilayer circuit board 20 thus manufactured includes the insulating base materials 22 and 24 that are joined together without using adhesive layers. The reason of this is as follows: the second insulating base material 24 in a semi-cured state is joined to the first insulating base material 22 in manufacturing the unit component 60, and the first insulating base material 22 and the second insulating base material 24 in a semi-cured state are thermocompression-bonded while the second conductive paste 36 and the first metal layer 26 are thermocompression-bonded in laminating the plurality of the unit components 60. In addition, these manufacturing processes make both of the first metal layer 26 and the second metal layer 28 be embedded in the second insulating base material 24.

The trapezoidal metal layers 26 and 28 are formed in the multilayer circuit board 20 in such a manner that the trapezoidal shapes are alternately oriented. That is, in the multilayer circuit board 20, the first metal layers 26 and the second metal layers 28 are alternately arranged, and the small-diameter side of the trapezoidal shape of the first metal layer 26 is oriented in the bottom surface direction, whereas the small-diameter side of the trapezoidal shape of the second metal layer 28 is oriented in a direction opposite to the first metal layer 26 (in an upper side direction of the multilayer circuit board). Meanwhile, due to an etching process executed last, the top surface of the circuit board 20 is formed with the surface metal layer 62 having a trapezoidal shape that is large in diameter on the second surface 24b side of the second insulating base material 24. Thus, each of the surface metal layer 62 on the top surface and the second metal layer 28 immediately thereunder has a large-diameter side that faces the bottom surface direction, and therefore, the trapezoidal shape is not oriented in an alternate manner only at the top surface.

Each of the circuit board that is manufactured by the method for manufacturing a circuit board of this embodiment and the circuit board of this embodiment can also be used as a motherboard (support board) or an interposer (relay board). Each can be used particularly as a motherboard or an interposer for server or high-speed communication, or moreover, a circuit board for constituting a semiconductor element. In addition, each can also be used in an inspection apparatus that is used in quality determination of a semiconductor, a probe card, etc.

(Electronic Device)

An electronic device includes the circuit board described above and an electronic component, and moreover includes other components as necessary.

Examples of the electronic device include a smartphone, a tablet mobile terminal, and a computer.

What is claimed is:

1. A circuit board comprising:
a plurality of first insulating base materials and a plurality of second insulating base materials that are alternately laminated;
a first metal layer being formed into a pattern shape on a first surface of the first insulating base material;
a second metal layer being formed into a pattern shape on a second surface of the first insulating base material;
a first conductive paste being filled into a through hole of the first insulating base material so as to connect the first metal layer and the second metal layer; and
a second conductive paste being filled into a through hole of the second insulating base material so as to connect the second metal layer of the first insulating base material that is laminated on a first surface side of the second insulating base material, and the first metal layer of the first insulating base material that is laminated on a second surface side of the second insulating base material, the first metal layer being formed into a trapezoidal shape that is large in diameter on the first surface side of the first insulating base material, the second metal layer being formed into a trapezoidal shape that is large in diameter on the second surface side of the first insulating base material, the first metal layers and the second metal layers being laminated in such a manner that the trapezoidal shapes are alternately oriented, characterized in that the second metal layer of the first insulating base material that is laminated on the first surface side of the second insulating base material, is embedded in the first surface of the second insulating base material, and the first metal layer of the first insulating base material that is laminated on the second surface side of the second insulating base material, is embedded in the second surface of the second insulating base material.

2. The circuit board according to claim 1, characterized in that the first insulating base material and the second insulating base material are joined together without using an adhesive layer.

3. An electronic device comprising the circuit board according to claim 1 and an electronic component.

4. A method for manufacturing a circuit board, comprising:

a process of manufacturing a unit component, the unit component including a first insulating base material in a cured state and a second insulating base material in a semi-cured state, the first insulating base material including a first metal layer, a second metal layer, and a first through hole that is formed between the first metal layer and the second metal layer, the first metal layer being formed into a pattern shape on a first surface of the first insulating base material, the second metal layer being formed into a pattern shape on a second surface of the first insulating base material, the first through hole being charged with a first conductive paste that connects the first metal layer and the second metal layer, the second insulating base material being disposed on the second surface side of the first insulating base material and having a second through hole that communicates with the second metal layer, the second through hole being charged with a second conductive paste that is connected to the second metal layer; and a process of laminating a plurality of the unit components by joining to one another the first insulating base material of one of the plurality of the unit components and the second insulating base material of another unit component of the plurality of the unit components, characterized in that the first metal layer of the one unit component is embedded in the second insulating base material of the another unit component in joining to one another the first insulating base material of the one unit component of the plurality of the unit components and the second insulating base material of the another unit component of the plurality of the unit components.

* * * * *